United States Patent
Matsuno et al.

(10) Patent No.: US 6,653,714 B2
(45) Date of Patent: Nov. 25, 2003

(54) LATERAL BIPOLAR TRANSISTOR

(75) Inventors: Toshinobu Matsuno, Kyoto (JP); Takeshi Fukuda, Osaka (JP); Katsunori Nishii, Osaka (JP); Kaoru Inoue, Shiga (JP); Daisuke Ueda, Osaka (JP)

(73) Assignee: Matsushita Electronics Corp., Osaka (JP)

( * ) Notice: Subject to any disclaimer, the term of this patent is extended or adjusted under 35 U.S.C. 154(b) by 0 days.

(21) Appl. No.: 10/300,440

(22) Filed: Nov. 20, 2002

(65) Prior Publication Data

US 2003/0096478 A1 May 22, 2003

Related U.S. Application Data

(62) Division of application No. 09/687,251, filed on Oct. 13, 2000, now Pat. No. 6,503,808.

(30) Foreign Application Priority Data

Oct. 15, 1999 (JP) .............................................. 11-294624

(51) Int. Cl.[7] .............................................. H01L 27/082
(52) U.S. Cl. ....................... 257/588; 257/592; 257/565; 257/557
(58) Field of Search .................................. 257/343, 565, 257/592, 588, 557, 587; 438/335

(56) References Cited

U.S. PATENT DOCUMENTS

| | | |
|---|---|---|
| 5,147,818 A | 9/1992 | Hikida |
| 5,498,567 A | 3/1996 | Klose et al. |
| 5,504,018 A | 4/1996 | Sato |
| 5,510,647 A | 4/1996 | Nakajima et al. |
| 5,567,631 A | 10/1996 | Hsu et al. |
| 5,580,797 A | 12/1996 | Miwa et al. |
| 6,323,075 B1 * | 11/2001 | Ammo et al. ............... 438/202 |
| 2001/0008298 A1 | 7/2001 | Sato |

OTHER PUBLICATIONS

Sato et al., A Super Self–Aligned Selectively Grown SiGe Base (SSSB) Bipolar Transistor Fabricated by Cold–Wall Type UHV/CVD Technology, 1994 IEEE Transactions on Electron Devices, vol. 41, No. 8, pp. 1373–1378.

Parke et al., A High–Performance Lateral Bipolar Transistory Fabricated on SIMOX, 1993 IEEE Electron Device Letters, vol. 14, No. 1, pp. 33–35.

* cited by examiner

*Primary Examiner*—Richard Elms
*Assistant Examiner*—Brad Smith
(74) *Attorney, Agent, or Firm*—RatnerPrestia

(57) ABSTRACT

A lateral bipolar transistor includes: a substrate; a first insulative region formed on the substrate; a first semiconductor region of a first conductivity type selectively formed on the first insulative region; a second insulative region formed so as to substantially cover the first semiconductor region; and a second semiconductor region of a second conductivity type different from the first conductivity type, a second semiconductor region being selectively formed, wherein: the second insulative region has a first opening which reaches a surface of the first semiconductor region, and the first semiconductor region has a second opening which reaches the underlying first insulative region, the second opening being provided in a position corresponding to the first opening of the second insulative region; the second semiconductor region is formed so as to fill the first opening and the second opening, thereby functioning as a base region; a lower portion of the second semiconductor region which at least fills the second opening is formed by lateral growth from a face of the first semiconductor region defining a side wall of the second opening; and the first semiconductor region includes an emitter region and a collector region formed therein.

7 Claims, 14 Drawing Sheets

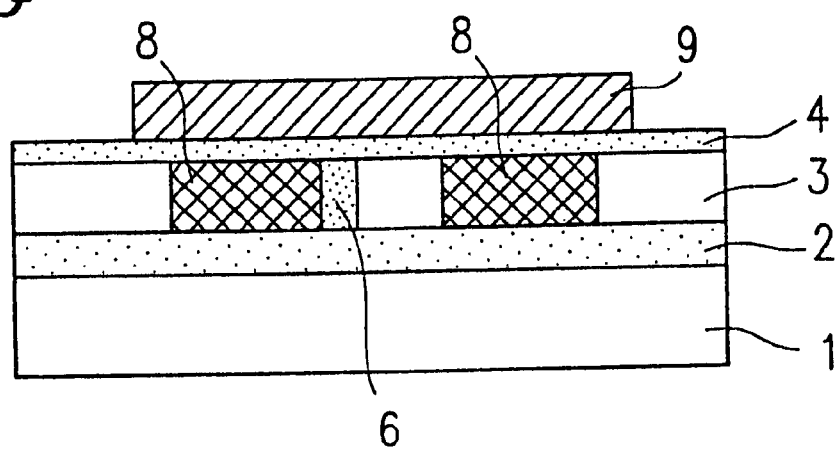
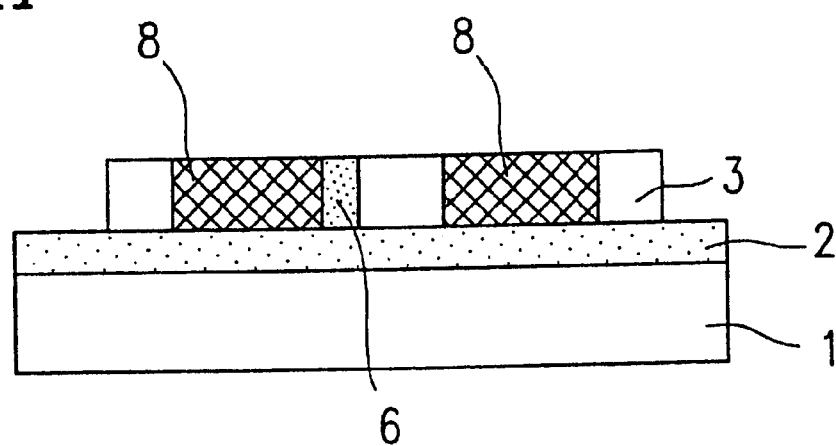
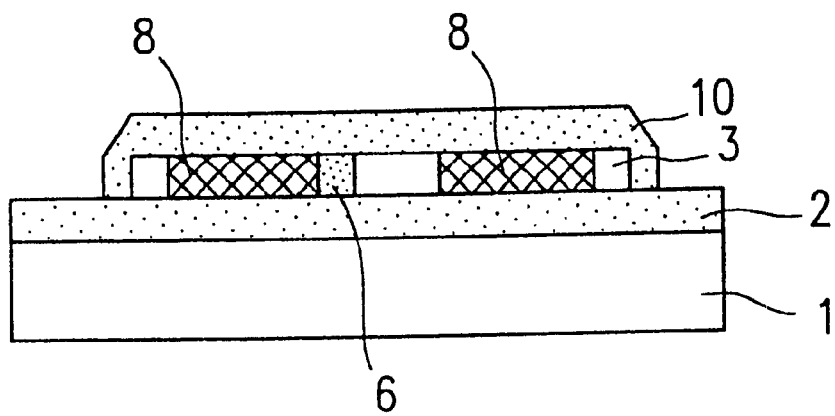

LATERAL BIPOLAR TRANSISTOR

This application is a divisional of U.S. patent application Ser. No. 09/687,251 filed Oct. 13, 2000, now U.S. Pat. No. 6,503,808.

BACKGROUND OF THE INVENTION

1. Field of the Invention

The present invention relates to a semiconductor device and a method for producing the same. In particular, the present invention relates to a lateral homo-junction or hetero-junction bipolar transistor incorporating an SOI (silicon on insulator) substrate, and a method for producing the same.

2. Description of the Related Art

FIG. 4 is a schematic cross-sectional view illustrating the structure of an npn-type vertical hetero-bipolar transistor (HBT) composed of SiGe/Si and produced by a conventional technique.

In accordance with this conventional vertical HBT, an n$^+$ type Si collector contact layer 302, an n$^-$ type Si collector layer 303, a p type SiGe true base region (layer) 304, a p$^+$ type SiGe external base region (layer) 305, an n type Si emitter layer 306, and an n$^+$ type Si emitter contact layer 307 are layered in this order on a silicon substrate 301. A collector electrode 308 is formed on an exposed surface of the n$^+$ type Si collector contact layer 302 which is formed by local etching. A base electrode 309 is formed on an exposed surface of the p$^+$ type SiGe external base region (layer) 305 which is also formed by local etching. Furthermore, an emitter electrode 310 is formed on the n$^+$ type Si emitter contact layer 307.

During the operation of the HBT, electrons which have been implanted from the n type Si emitter layer 306 into the p type SiGe true base region (layer) 304 flow into n$^-$ type Si collector layer 303 through diffusion, and drift as minority carriers, thereby providing a collector current. A portion of the electrons recombine inside, or in the vicinity of, the p type SiGe true base region (layer) 304 or the p$^+$ type SiGe external base region (layer) 305, thereby providing a base current. Since the size of the collector current is in proportion with the size of the base current, it is possible with this HBT to amplify an external signal by modulating the base current in accordance with the external signal.

In accordance with an HBT having the above-described structure, the base layers are formed of SiGe, so that the band gaps which exist between the base layers and the emitter layer in the valence band can be increased relative to the case where the base layers are formed of Si. As a result, the flow of holes into the emitter layer is reduced, whereby the carrier concentration in the base layers is increased and the base resistance is reduced.

In order to improve the performance of semiconductor integrated circuits in general, bipolar transistors having excellent high-speed operation characteristics are desired. Accordingly, efforts are being made to improve the high-speed operation characteristics of bipolar transistor by reducing the thickness of base layer and reducing the base-emitter parasitic capacitance or the base-collector parasitic capacitance.

For example, in order to enable a high frequency operation of the HBT having the structure as shown in FIG. 4 and provide improved high frequency characteristics, it is essential to reduce the base running time of carriers and reduce the parasitic capacitance components and resistive components.

In particular, in the case where the base resistance $R_B$ and the base-collector capacitance $C_{BC}$ are large, a large time constant ($=R_B \cdot C_{BC}$) is created, resulting in deteriorated high frequency characteristics.

In order to reduce the base-emitter parasitic capacitance or the base-collector parasitic capacitance, it is necessary to minimize the area of the base-emitter junction. However, conventional methods employing photolithography techniques cannot create a junction portion which is smaller than is possible to create given the microprocessing subtlety level achieved by photolithography techniques.

Moreover, according to conventional methods, the base layer in a base-emitter junction portion and a base extension layer (i.e., a layer which extends from the base layer to a base electrode) are generally produced by using the same crystal growing step(s). Therefore, reducing the thickness of the base layer also results in the reduction of the thickness of the base extension layer. Since this increases the electric resistance of the base extension layer, the time constant which is determined as a function of the electric resistance component of the base extension layer and the base-emitter capacitance component is also increased, thereby hindering high-speed operations. In this regard, the thickness of the base layer can only be reduced to a certain extent under the conventional methods.

In the structure illustrated in FIG. 4, the p$^+$ type SiGe external base region (layer) 305 having an enhanced p type carrier concentration is provided next to the p type SiGe true base region (layer) 304 in order to reduce the base resistance, and the base electrode 309 is formed on the p$^+$ type SiGe external base region (layer) 305. However, in accordance with this structure, a base-collector capacitance is created between the p$^+$ type SiGe external base region (layer) 305 and the n$^+$ type Si collector contact layer 302, whose capacitance value increases as the carrier concentration in the p$^+$ type SiGe external base region (layer) 305 is increased in order to decrease the base resistance. In other words, a trade-off relationship exists between the size of the base resistance and the size of the base-collector capacitance.

Furthermore, the high-speed operation characteristics of conventional devices are undermined due to the inter-device parasitic capacitance and the device-substrate parasitic capacitance.

SUMMARY OF THE INVENTION

According to one aspect of the present invention, there is provided a lateral bipolar transistor which includes: a substrate; a first insulative region formed on the substrate; a first semiconductor region of a first conductivity type selectively formed on the first insulative region; a second insulative region formed so as to substantially cover the first semiconductor region; and a second semiconductor region of a second conductivity type different from the first conductivity type, a second semiconductor region being selectively formed, wherein: the second insulative region has a first opening which reaches a surface of the first semiconductor region, and the first semiconductor region has a second opening which reaches the underlying first insulative region, the second opening being provided in a position corresponding to the first opening of the second insulative region; the second semiconductor region is formed so as to fill the first opening and the second opening, thereby functioning as a base region; a lower portion of the second semiconductor region which at least fills the second opening is formed by lateral growth from a face of the first semiconductor region defining a side wall of the second opening; and the first semiconductor region includes an emitter region and a collector region formed therein.

In one embodiment of the invention, the first semiconductor region is composed essentially of monocrystalline n type Si, and the second semiconductor region is composed essentially of p type $Si_xGe_{1-x}$ (where $0 \leq x \leq 1$).

In another embodiment of the invention, the lower portion of the second semiconductor region which at least fills the second opening has a multilayer structure at least including a first portion and a second portion, the first portion being in contact with the face of the first semiconductor region defining the side wall of the second opening, and the second portion being in contact with the first portion.

In still another embodiment of the invention, the first portion is composed essentially of non-doped $Si_yGe_{1-y}$ (where $0 \leq y \leq 1$), and the second portion is composed essentially of $Si_xGe_{1-x}$ (where $0 \leq x \leq 1$) of the second conductivity type.

In still another embodiment of the invention, the first portion is composed essentially of Si of the first conductivity type, and the second portion is composed essentially of $Si_xGe_{1-x}$ (where $0 \leq x \leq 1$) of the second conductivity type.

In still another embodiment of the invention, an upper portion of the second semiconductor region which fills the first opening of the second insulative region has a carrier concentration higher than a carrier concentration in the lower portion of the second semiconductor region which at least fills the second opening of the first semiconductor region.

In still another embodiment of the invention, an upper portion of the second semiconductor region which fills the first opening of the second insulative region has a carrier concentration higher than a carrier concentration in the lower portion of the second semiconductor region which at least fills the second opening of the first semiconductor region, and the upper portion of the second semiconductor region having the higher carrier concentration is also present on a surface of the second insulative region.

According to another aspect of the invention, there is provided a method for producing a lateral bipolar transistor, including the steps of: forming a first semiconductor region of a first conductive type on a first insulative region, the first insulative region being provided on a substrate: selectively providing a region to function as an emitter region and a region to function as a collector region in the first semiconductor region; forming a second insulative region so as to substantially cover the first semiconductor region; forming a first opening in the second insulative region so as to reach a surface of the first semiconductor region; forming a second opening in the first semiconductor region so as to reach the underlying first insulative region, the second opening being provided in a position corresponding to the first opening of the second insulative region; and selectively forming a second semiconductor region of a second conductivity type different from the first conductivity type so as to fill the first opening and the second opening, the second semiconductor region functioning as a base region, wherein a lower portion of the second semiconductor region which at least fills the second opening is formed by lateral growth from a face of the first semiconductor region defining a side wall of the second opening.

In one embodiment of the invention, the first semiconductor region is composed essentially of monocrystalline n type Si, and the second semiconductor region is composed essentially of p type $Si_xGe_{1-x}$ (where $0 \leq x \leq 1$).

In another embodiment of the invention, the step of forming the second semiconductor region includes forming a multilayer structure as the second opening is filled, the multilayer structure at least including a first portion and a second portion such that the first portion is in contact with the face of the first semiconductor region defining the side wall of the second opening, and the second portion is in contact with the first portion.

In still another embodiment of the invention, the step of forming the multilayer structure includes forming the first portion from non-doped $Si_yGe_{1-y}$ (where $0 \leq y \leq 1$), and forming the second portion from $Si_xGe_{1-x}$ (where $0 \leq x \leq 1$) of the second conductivity type.

In still another embodiment of the invention, the step of forming the multilayer structure includes forming the first portion from Si of the first conductivity type, and forming the second portion from $Si_xGe_{1-x}$ (where $0 \leq x \leq 1$) of the second conductivity type.

In still another embodiment of the invention, the second semiconductor region is formed in such a manner that an upper portion of the second semiconductor region which fills the first opening of the second insulative region has a carrier concentration higher than a carrier concentration in the lower portion of the second semiconductor region which at least fills the second opening of the first semiconductor region.

In still another embodiment of the invention, the step of forming the second semiconductor region includes: forming the lower portion of the second semiconductor region which at least fills the second opening by lateral growth from the face of the first semiconductor region defining the side wall of the second opening; and forming via a non-selective growth process an upper portion of the second semiconductor region which fills the first opening of the second insulative region so as to have a carrier concentration higher than a carrier concentration in the lower portion of the second semiconductor region, wherein the upper portion of the second semiconductor region having the higher carrier concentration is formed via the non-selective growth process so as to be also present on a surface of the second insulative region.

In still another embodiment of the invention, the step of forming the second opening includes removing via dry etching a portion of the first semiconductor region corresponding to the second opening, wherein the step of forming the second semiconductor region includes: performing a thermal treatment for attaining substantial recovery from damage which was inflicted during the dry etching on a portion corresponding to the side wall of the second opening; forming the second semiconductor region so as to fill the second opening after the thermal treatment; and further growing the second semiconductor region so as to fill the first opening of the second insulative region.

In still another embodiment of the invention, at least the region of the first semiconductor region to function as the emitter region is formed by impurity diffusion or ion implantation of a first impurity or ion into a first predetermined location within the first semiconductor region.

In still another embodiment of the invention, the method further includes the steps of: forming the region of the first semiconductor region to function as the emitter region by impurity diffusion or ion implantation of a first impurity or ion into a first predetermined location within the first semiconductor region; and forming the collector region by impurity diffusion or ion implantation of a second impurity or ion into a second predetermined location within the first semiconductor region, the first and second predetermined locations being different from each other, wherein the emitter region and the collector region have different carrier concentrations.

A lateral bipolar transistor which is produced according to the present invention includes an active region whose thickness is equal to the thickness of a device structural silicon layer which is formed on an oxidation film provided on an SOI substrate. Therefore, it is possible to reduce the thickness of the active region down to the minimum level that can be attained by polish processing techniques or oxygen injection techniques. Since the area of a base-emitter junction is determined depending on the thickness of the active region in accordance with the lateral bipolar transistor of the present invention, it is possible to reduce the area of the base-emitter junction as compared to that of a bipolar transistor which is produced by conventional lithography techniques.

Since there is no base extension layer is provided, an electrode ohmic contact can be directly formed with a true base layer. As a result, the base resistance is reduced thereby enabling a higher operation speed.

By employing an SOI substrate, a silicon oxide film provides electrical insulation can be obtained between devices or between the device and the substrate. As a result, inter-device parasitic capacitance and the device-substrate parasitic capacitance can be reduced, so that the high-speed operation characteristics that are inherent in each device can be adequately elicited.

Thus, the invention described herein makes possible the advantages of (1) providing a lateral bipolar transistor which has a small parasitic region and a very thin epitaxial base layer, the lateral bipolar transistor having improved high-speed operation characteristics; and a method for producing such a lateral bipolar transistor.

These and other advantages of the present invention will become apparent to those skilled in the art upon reading and understanding the following detailed description with reference to the accompanying figures.

BRIEF DESCRIPTION OF THE DRAWINGS

FIGS. 1A, 1B, 1C, 1D, 1E, 1F, 1G, 1H, 1I, 1J, 1K, 1L, and 1M are cross-sectional views illustrating respective production steps for obtaining a lateral bipolar transistor according to Example 1 of the present invention.

The entire disclosure of U.S. patent application Ser. No. 09/687,251, filed Oct. 13, 2000, is expressly incorporated by reference herein.

DESCRIPTION OF THE PREFERRED EMBODIMENTS

Hereinafter, the present invention will be described by way of examples, with reference to the accompanying figures.

EXAMPLE 1

An npn type lateral SiGe hetero-bipolar transistor (HBT) according to Example 1 of the present invention will be described.

FIGS. 1A to 1M are cross-sectional views illustrating respective production steps for obtaining an npn type lateral SiGe HBT according to Example 1 of the present invention. Hereinafter, a method for producing an npn type lateral SiGe HBT according to Example 1 of the present invention will be described, following the order of respective steps.

Figure 1A:
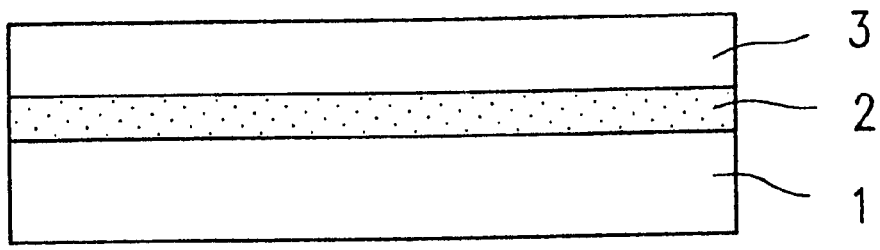

First, as shown in FIG. 1A, an SOI substrate which has been formed by an attachment technique or a SIMOX (separation by implanted oxygen) technique is prepared. The SOI substrate includes a device structural silicon layer (n type monocrystalline silicon layer) 3 and an embedded $SiO_2$ film (which serves as a "first $SiO_2$ film") 2 formed on a silicon support substrate 1. The device structural silicon layer 3 has a thickness of about 2000 angstroms. The embedded $SiO_2$ film 2 has a thickness of about 300 nm or more in order to reduce the parasitic capacitance between the device structural silicon layer 3 and the silicon support substrate 1. The n type doping amount in the device structural silicon layer 3 is about $5\times10^{16}$ cm$^{-3}$ to about $5\times10_{17}$ cm$_{-3}$, which corresponds to the doping amount in a collector layer that is to be formed later.

Figure 1B:
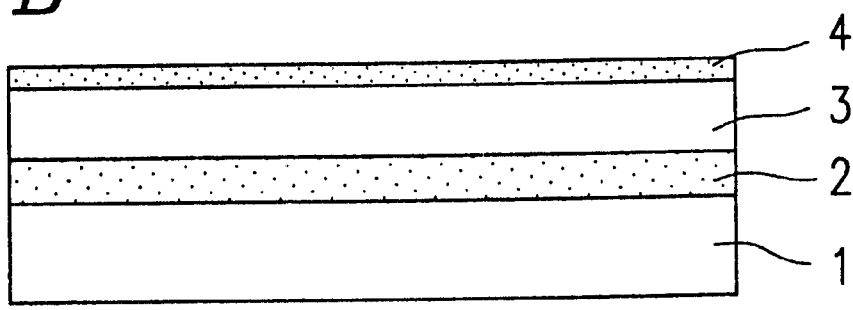

Next, as shown in FIG. 1B, the surface of the device structural silicon layer 3 is oxidized so as to form a protective oxidation film (which serves as a "second $SiO_2$ film") 4 having a thickness of about 10 nm to about 50 nm, whereby the surface of the device structural silicon layer 3 is protected.

Figure 1C:
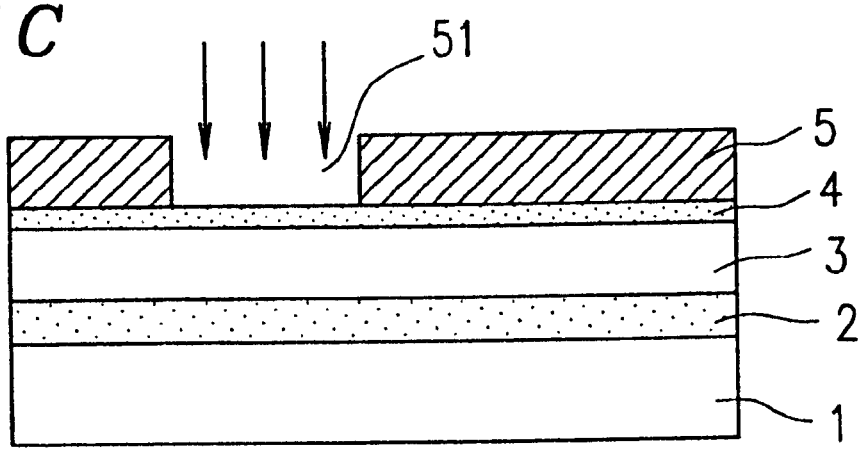
Figure 1D:
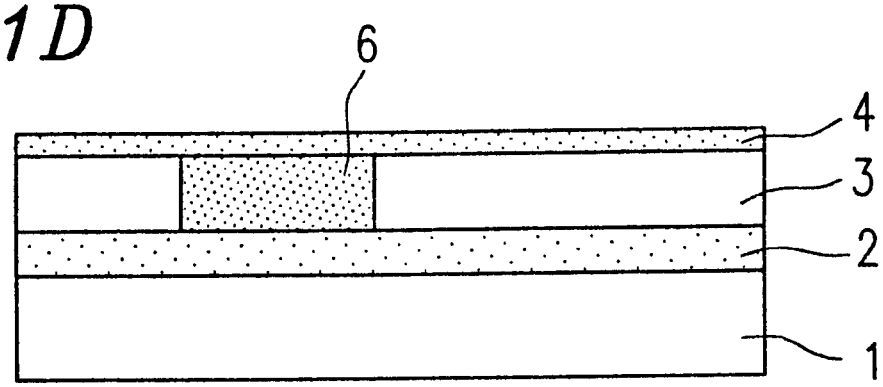

Next, as shown in FIG. 1C, a resist layer (or "resist pattern") 5 having an opening 51 in a portion in which an emitter region 6 (see FIG. 1D) is to be formed is provided on the protective oxidation layer 4 by photolithography. Then, by performing an ion implantation process over the entire surface while utilizing the resist layer 5 as a mask, the n type emitter region 6 is formed as shown in FIG. 1D. Thereafter, the resist layer 5 is removed.

In the case of an npn type device, an n type emitter and an n type collector are to be formed. Therefore, an n type dopant, e.g., phosphorous (P) or arsenic (As), is used as an ion species for the above ion implantation process. Such ion species may be implanted at a doping amount of about $5\times10^{18}$ cm$^{-3}$ to about $5\times10^{20}$ cm$^{-3}$.

Figure 1E:
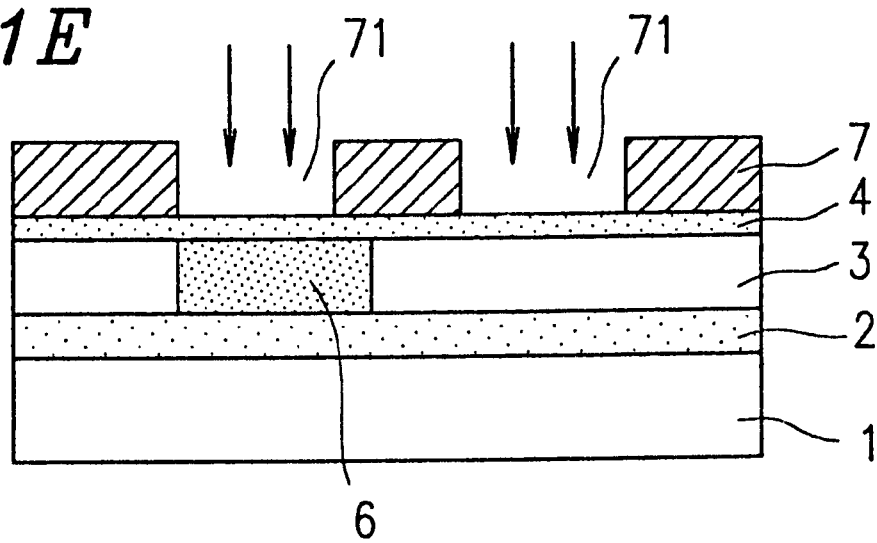
Figure 1F:
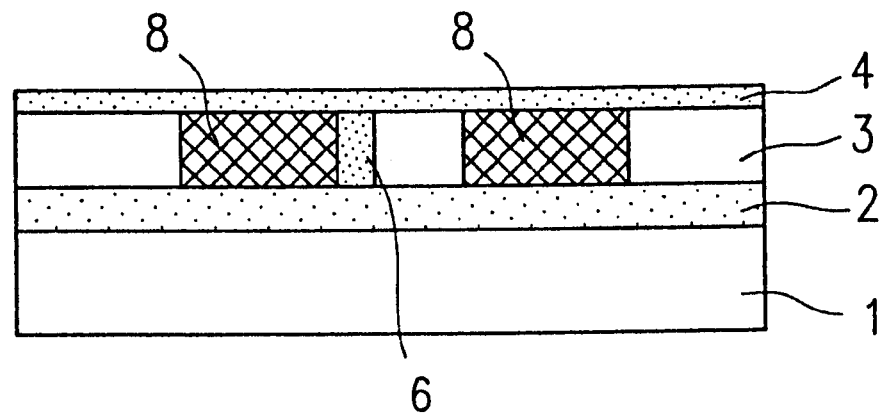

Next, as shown in FIG. 1E, a further resist layer 7 having openings 71 corresponding to portions in which n type Si ohmic contact regions 8 (see FIG. 1F) are to be formed is provided on the protective oxidation layer 4 by photolithography. The n type Si ohmic contact regions 8 will function as an emitter contact region and a collector contact region. Then, by performing an ion implantation process over the entire surface while utilizing the resist layer 7 as a mask, the n type Si ohmic contact regions (i.e., an emitter contact region and a collector contact region) 8 are formed as shown in FIG. 1F. Thereafter, the resist layer 7 is removed.

An n type dopant, e.g., P or As, is used as an ion species for the above ion implantation process. Such ion species may be implanted at a high doping amount of about $1\times10^{19}$ cm$^{-3}$ or more in order to reduce the contact resistance of the electrodes. The resist masking layer 7 which is utilized for the above ion implantation process is patterned so that the ends of the resultant n type Si ohmic contact regions 8 will not overlap with the collector end of the previously-formed n type Si emitter region 6 and that the n type Si emitter region 6 will be interposed between the n type Si ohmic contact regions 8.

Next, as shown in FIG. 1G, from the perspective of device separation, a further resist layer 9 is provided on the protective oxidation layer 4 by photolithography in a portion overlying a region to become an active region of the HBT. Then, the device structural silicon layer 3 is subjected to a dry or wet etching while utilizing the resist layer 9 as a mask, until the embedded $SiO_2$ film 2 is exposed. Thus, a mesa-separated active region is formed (FIG. 1H). The remainder of the device structural silicon layer 3 on the mesa-separated active region will function as a collector region 3.

Although the present example illustrates the case where a simple mesa separation technique is used as a method for achieving device separation, the present invention is not limited thereto. Any other separation method may be suitably used, e.g., a pn separation method which involves forming the surrounding portion of an active region with a material of the opposite conductive type from the conductivity type of the active region, or a separation method which involves oxidizing the surrounding portion of an active region to form $SiO_2$.

Next, a thermal treatment for activating the implanted dopant is performed. The treatment is typically conducted at a temperature of about 900° C. to about 1100° C.

Next, the entire substrate surface is subjected to a thermal oxidation process, thereby forming a third $SiO_2$ film 10 on the surface of the active region as shown in FIG. 1I. As the method for forming the third $SiO_2$ film 10, it is also possible to first perform a very shallow surface thermal oxidation and then perform a CVD (chemical vapor deposition) process to form a further $SiO_2$ film, instead of subjecting the entire substrate surface to a thermal oxidation process. In the case of employing thermal oxidation, since the surface of the device structural silicon layer 3 is partially oxidized so that the device structural silicon layer 3 has a reduced thickness, it is necessary to ensure that the device structural silicon layer 3 has a larger initial thickness which accounts for the decrease in thickness due to oxidation. The third $SiO_2$ film 10 typically has a thickness of 100 nm to about 200 nm.

Figure 1J:
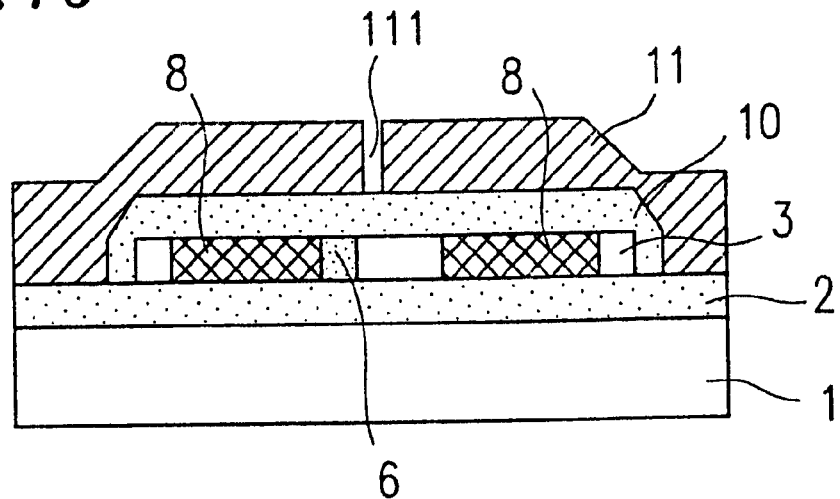

Next, in order to form a base region, a resist 11 for electron beam exposure is applied. By performing an electron beam exposure and then a developing process, a resist layer 11 having an opening 111 which is about 0.05 μm to about 0.2 μm wide is formed, as shown in FIG. 1J. As the resist 11 for electron beam exposure, a resist material composed essentially of PMMA (polymethyl methacrylate), which is commonly used for electron beam lithography, may be used. In order to facilitate dry-etching of the third $SiO_2$ film by using the resist 11 as a mask, it is preferable to employ a resist material having excellent dry-etching resistance, e.g., ZEP (Nippon Zeon) for the resist 11.

Figure 1K:
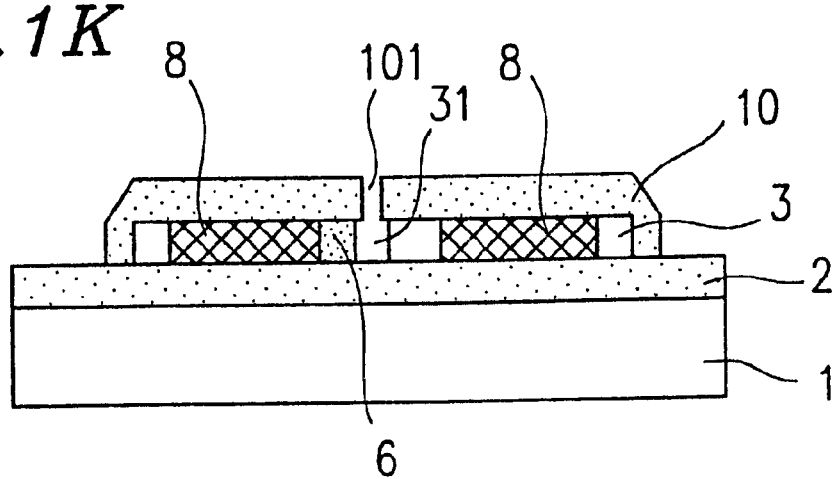

Next, the third $SiO_2$ film 10 is anisotropically etched so as to allow the opening 111 of the resist 11 for electron beam exposure to be transcribed to the third $SiO_2$ film 10, so that the third $SiO_2$ film 10 has an opening 101 (see FIG. 1K). A dry etching utilizing a high-density plasma which causes minimum damage is utilized for this etching process, e.g., by employing ECR (electron cyclotron resonance) or high-density ICP (induction coupled plasma), which provide excellent anisotropy.

The method for forming the opening 101 in the third $SiO_2$ film 10 is not limited to the EB exposure method as described above, but any other method may be employed, e.g., an exposure technique employing an excimer light source, a phase shift exposure technique, an X-ray exposure technique, or the like.

Next, by utilizing the third $SiO_2$ film 10 having the opening 101 and the resist 11 having the opening 111 as a mask, the device structural silicon layer 3 is etched until the underlying $SiO_2$ film 2 is exposed. Thus, an opening 31 is formed in the device structural silicon layer 3, as shown in FIG. 1K. A dry etching utilizing a high-density plasma which causes minimum damage is utilized for this etching process, e.g., by employing ECR or high-density ICP, which provide excellent anisotropy. Thereafter, the resist 11 for electron beam exposure is removed. In order to remove any damaged layer that has emerged through the aforementioned dry etching process and to purify the growth front prior to effecting the crystal growth of an SiGe layer 12 which will become a base layer (see FIG. 1L), the exposed surface of the device structural silicon layer 3 (which defines the side walls of the opening 31) is etched. Specifically, in order to remove a sufficient amount of damaged layer while preventing the opening from becoming excessively wide, an etching process using fuming nitric acid and an etching process using hydrofluoric acid are alternated, so that the surface of the device structural silicon layer 3 is etched away along its side walls by several nm to about 10 nm.

Figure 1L:
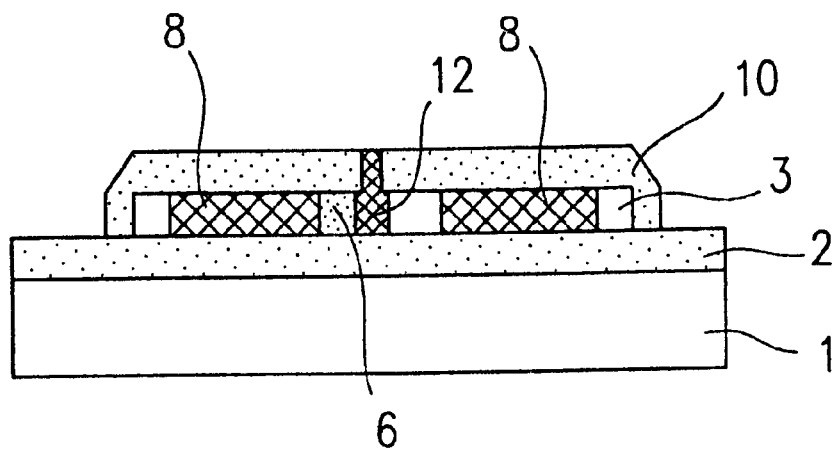

Next, as shown in FIG. 1L, a monocrystalline p type SiGe layer 12 to become a true base layer is formed on the inner side walls of the opening 31 of the device structural silicon layer 3 that have been exposed through the aforementioned etching process, by performing a selective epitaxial growth process via a CVD technique using dichlorosilane as a material gas. The monocrystalline p type SiGe layer 12 grows so as to fill the opening 31 of the device structural silicon layer 3. The monocrystalline p type SiGe layer 12 grows so as to have a lateral thickness (i.e., thickness along a direction which is parallel to the substrate surface) of about 0.05 μm to about 0.2 μm, depending on the width of the opening 31.

More specifically, during the above growth process of the monocrystalline p type SiGe layer 12, the monocrystalline p type SiGe layer 12 grows along the lateral direction from both inner side walls of the opening 31 of the device structural silicon layer 3. A facet appears on the upper side of the growing monocrystalline p type SiGe layer 12. As the lateral growth proceeds, portions of the monocrystalline p type SiGe layer 12 growing from both side walls finally meet substantially in the middle, thereby filling the opening 31 of the device structural silicon layer 3. When the laterally growing portions of the monocrystalline p type SiGe layer 12 have just met, only the aforementioned facet is exposed on the upper surface of the p type SiGe layer 12 which fills the opening 31. Then, the monocrystalline p type SiGe layer 12 keeps growing in the upper direction (i.e., perpendicularly to the substrate surface) from this facet. As a result, as shown in FIG. 1L, the opening 101 of the third $SiO_2$ film 10, which is located above the opening 31 of the device structural silicon layer 3, is also filled with what has grown of the monocrystalline p type SiGe layer 12.

Since Si and Ge have different crystal lattice constants, growing SiGe crystal on Si will eventually result in the generation of crystal defects as the thickness of the grown film exceeds a predetermined thickness (hereinafter referred to as the "critical thickness"), which detracts from the crystallinity of the product, assuming a constant Ge component ratio in SiGe. According to the present example, as described above, the growth of the monocrystalline SiGe layer 12 on the inner side walls of the opening 31 of the device structural silicon layer 3 occurs along the lateral direction (i.e., in a direction which is parallel to the substrate surface). Therefore, the aforementioned critical thickness is determined as a function of the width (hereinafter referred to as the "opening width") of the opening 31 of the device structural silicon layer 3. Although the relationship between the exact composition of a SiGe material and the critical thickness in a lateral growth scheme is rather unclear, the relationship is presumably similar to its counterpart for the usual vertical growth scheme (which involves crystal growth in the direction perpendicular to the substrate surface). Accordingly, the Ge component ratio in the monocrystalline SiGe layer 12 is selected so that the value of the critical thickness as a function of the Ge component ratio becomes substantially larger than the value of the opening width.

The doping amount for the monocrystalline p type SiGe layer 12 may be about $1\times10^{18}$ cm$^{-3}$ to about $5\times10^{19}$ cm$^{-3}$.

Alternatively, a two-step doping may be performed by employing a doping amount of about $1\times10^{18}$ cm$^{-3}$ to about $5\times10^{19}$ cm$^{-3}$ for a lower portion of the monocrystalline p type SiGe layer 12 spanning the same thickness as that of the active region defined by the device structural silicon layer 3 (i.e., a portion corresponding to a portion 212 in FIG. 3L; described later in connection with Example 3 of the present invention), and by employing a doping amount on the order of $10^{19}$ cm$^{-3}$ to about $10^{20}$ cm$^{-3}$ for any portion of the monocrystalline p type SiGe layer 12 above the upper face of the active region (=the device structural silicon layer 3) in order to reduce the contact resistance.

The thickness of the monocrystalline p type SiGe layer 12 along the vertical direction (i.e., in the direction perpendicular to the substrate surface) is preferably set to a value which is equal to or greater than the thickness of the device structural silicon layer 3 composing the active region. As a result, a base electrode 14 and either side wall of the emitter layer 6 or the collector layer 3 are prevented from directly contacting each other to cause electrical short-circuiting during the formation of the base electrode 14.

Next, in preparation for the formation of the base electrode 14, a resist pattern (not shown) having an opening corresponding to a portion in which the base electrode 14 will be formed is formed by photolithography so as to cover the SiO$_2$ film 10. Next, a metal layer for composing the base electrode 14 is deposited, followed by a lift-off process. Thus, the base electrode 14 is formed in a predetermined pattern. The base electrode 14 is formed above and in electrical contact with the monocrystalline p type SiGe layer 12 (true base layer).

Finally, predetermined portions of the third SiO$_2$ film 10 (i.e., portions overlying the ohmic contact regions 8 to function as an emitter contact layer and a collector contact layer) are etched away, where a collector electrode 15 and an emitter electrode 13 are formed by using a metal such as Al.

Figure 1M:
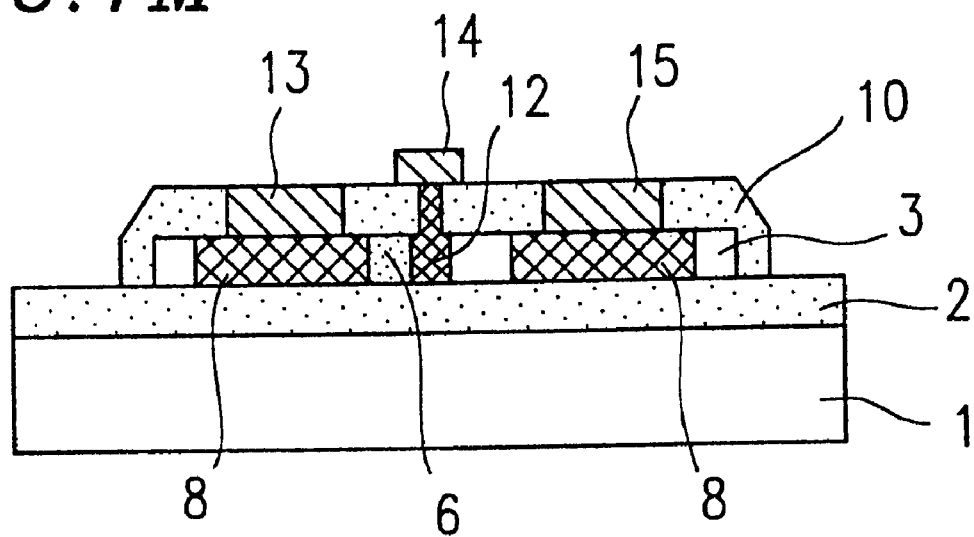

Through the aforementioned steps, a lateral heterojunction bipolar transistor incorporating an SOI substrate according to the present invention having the structure shown in FIG. 1M is completed.

In another embodiment of the present invention, a lateral homo-junction bipolar transistor incorporating an SOI substrate may be produced, instead of the above-described lateral hetero-junction bipolar transistor. This can be accomplished by epitaxially growing a monocrystalline p type Si layer, instead of the monocrystalline p type SiGe layer 12, so as to fill the opening 31 of the device structural silicon layer 3 and the opening 101 of the third SiO$_2$ film 10 during the process illustrated in FIG. 1L. By allowing this monocrystalline p type Si layer to function as a true base layer, a lateral homo-junction bipolar transistor can be formed by performing the other processes in a manner similar to the above.

More generally, a layer of a composition expressed as p-Si$_x$Ge$_{1-x}$ (where $0 \leq x \leq 1$) may be epitaxially grown so as to fill the opening 31 of the device structural silicon layer 3 and the opening 101 of the third SiO$_2$ film 10 to function as a true base layer.

EXAMPLE 2

An npn type lateral SiGe hetero-bipolar transistor (HBT) according to Example 2 of the present invention will be described.

FIGS. 2A to 2M are cross-sectional views illustrating respective production steps for obtaining an npn type lateral SiGe HBT according to Example 2 of the present invention. Hereinafter, a method for producing an npn type lateral SiGe HBT according to Example 2 of the present invention will be described, following the order of respective steps.

Figure 2A:
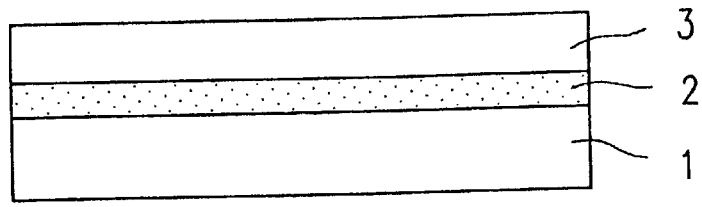
FIGS. 2A, 2B, 2C, 2D, 2E, 2F, 2G, 2H, 2I, 2J, 2K, 2L, and 2M are cross-sectional views illustrating respective production steps for obtaining a lateral bipolar transistor according to Example 2 of the present invention.

First, as shown in FIG. 2A, an SOI substrate which has been formed by an attachment technique or a SIMOX technique is prepared. The SOI substrate includes a device structural silicon layer (n type monocrystalline silicon layer) 3 and an embedded SiO$_2$ film (which serves as a "first Sio$_2$ film") 2 formed on a silicon support substrate 1. The device structural silicon layer 3 has a thickness of about 2000 angstroms. The embedded SiO$_2$ film 2 has a thickness of about 300 nm or more in order to reduce the parasitic capacitance between the device structural silicon layer 3 and the silicon support substrate 1. The n type doping amount in the device structural silicon layer 3 is about $5\times10^{16}$ cm$^{-3}$ to about $5\times10^{17}$ cm$^3$, which corresponds to the doping amount in a collector layer that is to be formed later.

Figure 2B:
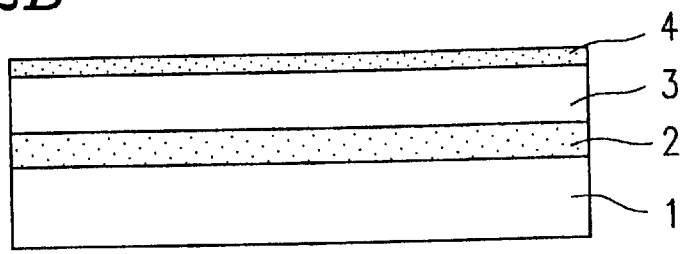

Next, as shown in FIG. 2B, the surface of the device structural silicon layer 3 is oxidized so as to form a protective oxidation film (which serves as a "second SiO$_2$ film") 4 having a thickness of about 10 nm to about 50 nm, whereby the surface of the device structural silicon layer 3 is protected.

Figure 2C:
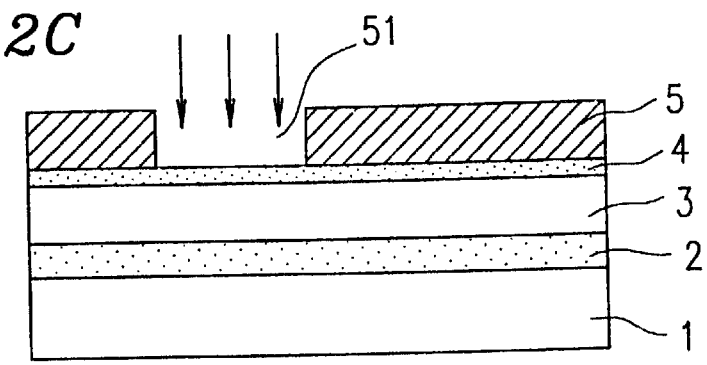
Figure 2D:
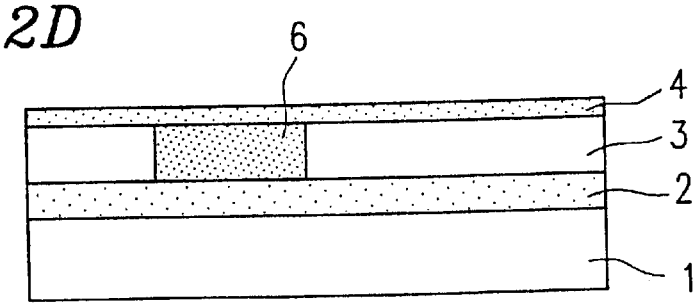

Next, as shown in FIG. 2C, a resist layer (or "resist pattern") 5 having an opening 51 in a portion in which an emitter region 6 (see FIG. 2D) is to be formed is provided on the protective oxidation layer 4 by photolithography. Then, by performing an ion implantation process over the entire surface while utilizing the resist layer 5 as a mask, the n type emitter region 6 is formed as shown in FIG. 2D. Thereafter, the resist layer 5 is removed.

In the case of an npn type device, an n type emitter and an n type collector are to be formed. Therefore, an n type dopant, e.g., phosphorous (P) or arsenic (As), is used as an ion species for the above ion implantation process. Such ion species may be implanted at a doping amount of about $5\times10^8$ cm$^{-3}$ to about $5\times10^{20}$ cm$^{-3}$.

Figure 2E:
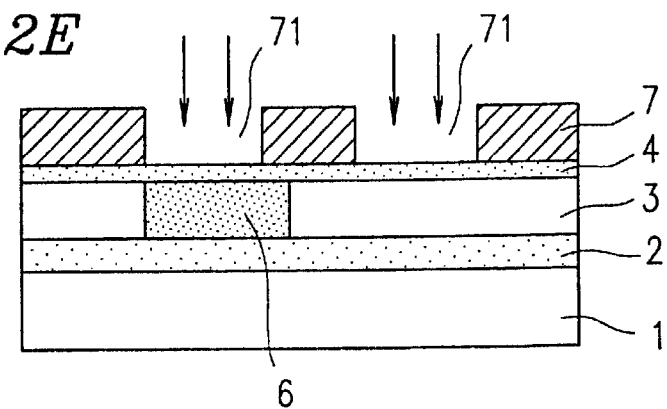
Figure 2F:
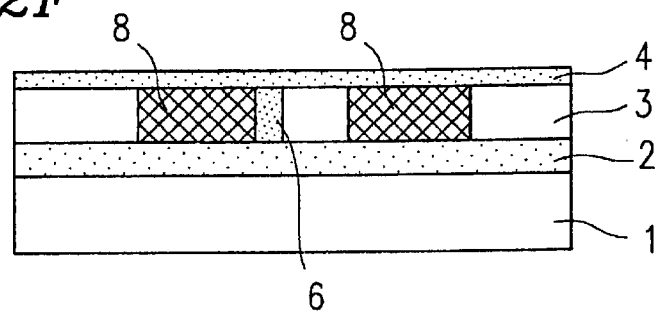

Next, as shown in FIG. 2E, a further resist layer 7 having openings 71 corresponding to portions in which n type Si ohmic contact regions 8 (see FIG. 2F) are to be formed is provided on the protective oxidation layer 4 by photolithography. The n type Si ohmic contact regions 8 will function as an emitter contact region and a collector contact region. Then, by performing an ion implantation process over the entire surface while utilizing the resist layer 7 as a mask, then type Si ohmic contact regions (i.e., an emitter contact region and a collector contact region) 8 are formed as shown in FIG. 2F. Thereafter, the resist layer 7 is removed.

An n type dopant, e.g., P or As, is used as an ion species for the above ion implantation process. Such ion species may be implanted at a high doping amount of about $1\times10^{19}$ cm$^{-3}$ or more in order to reduce the contact resistance of the electrodes. The resist masking layer 7 which is utilized for the above ion implantation process is patterned so that the ends of the resultant n type Si ohmic contact regions 8 will not overlap with the collector end of the previously-formed n type Si emitter region 6 and that the n type Si emitter region 6 will be interposed between the n type Si ohmic contact regions 8.

Figure 2G:
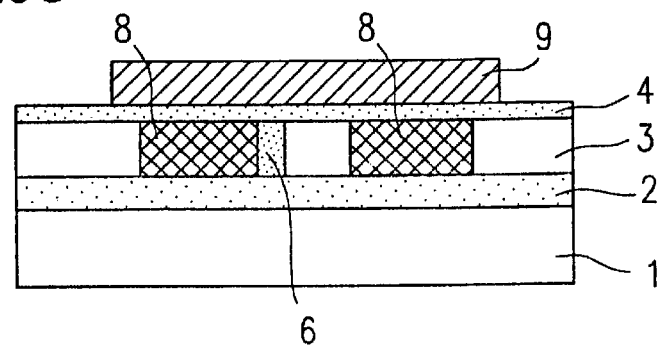
Figure 2H:
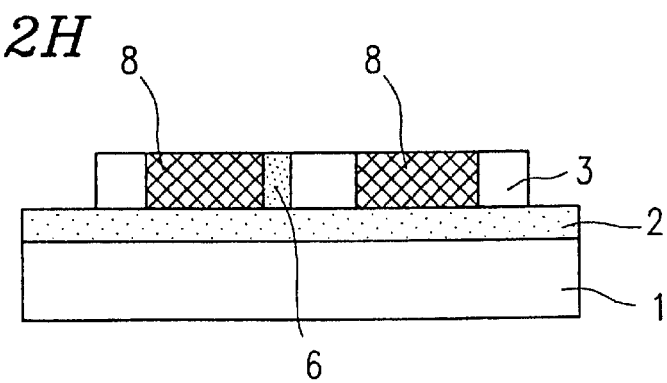

Next, as shown in FIG. 2G, from the perspective of device separation, a further resist layer 9 is provided on the protective oxidation layer 4 by photolithography in a portion overlying a region to become an active region of the HBT. Then, the device structural silicon layer 3 is subjected to a dry or wet etching while utilizing the resist layer 9 as a mask, until the embedded $SiO_2$ film 2 is exposed. Thus, a mesa-separated active region is formed (FIG. 2H). The remainder of the device structural silicon layer 3 on the mesa-separated active region will function as a collector region 3.

Although the present example illustrates the case where a simple mesa separation technique is used as a method for achieving device separation, the present invention is not limited thereto. Any other separation method may be suitably used, e.g., a pn separation method which involves forming the surrounding portion of an active region with a material of the opposite conductive type from the conductivity type of the active region, or a separation method which involves oxidizing the surrounding portion of an active region to form $SiO_2$.

Next, a thermal treatment for activating the implanted dopant is performed. The treatment is typically conducted at a temperature of about 900° C. to about 1100° C.

Figure 2I:
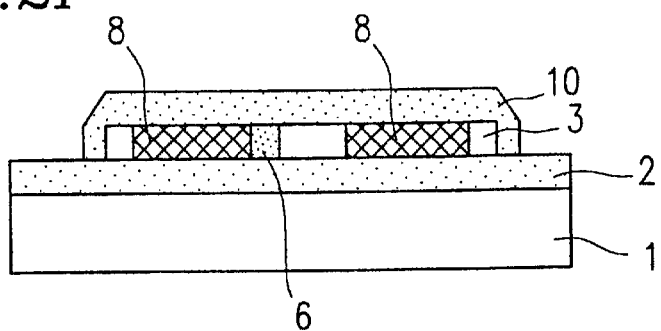

Next, the entire substrate surface is subjected to a thermal oxidation process, thereby forming a third $SiO_2$ film 10 on the surface of the active region as shown in FIG. 2I. As the method for forming the third $SiO_2$ film 10, it is also possible to first perform a very shallow surface thermal oxidation and then perform a CVD process to form a further $SiO_2$ film, instead of subjecting the entire substrate surface to a thermal oxidation process. In the case of employing thermal oxidation, since the surface of the device structural silicon layer 3 is partially oxidized so that the device structural silicon layer 3 has a reduced thickness, it is necessary to ensure that the device structural silicon layer 3 has a larger initial thickness which accounts for the decrease in thickness due to oxidation. The third $SiO_2$ film 10 typically has a thickness of 100 nm to about 200 nm.

Figure 2J:
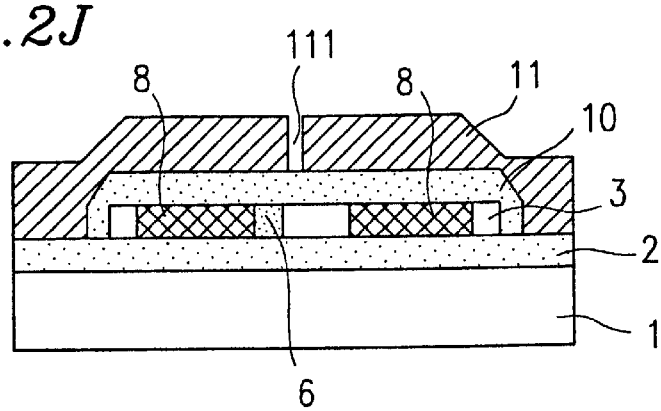

Next, in order to form a base region, a resist 11 for electron beam exposure is applied. By performing an electron beam exposure and then a developing process, a resist layer 11 having an opening 111 which is about 0.05 $\mu$m to about 0.2 $\mu$m wide is formed, as shown in FIG. 2J. As the resist 11 for electron beam exposure, a resist material composed essentially of PMMA, which is commonly used for electron beam lithography, may be used. In order to facilitate dry-etching of the third $SiO_2$ film by using the resist 11 as a mask, it is preferable to employ a resist material having excellent dry-etching resistance, e.g., ZEP (Nippon Zeon) for the resist 11.

Figure 2K:
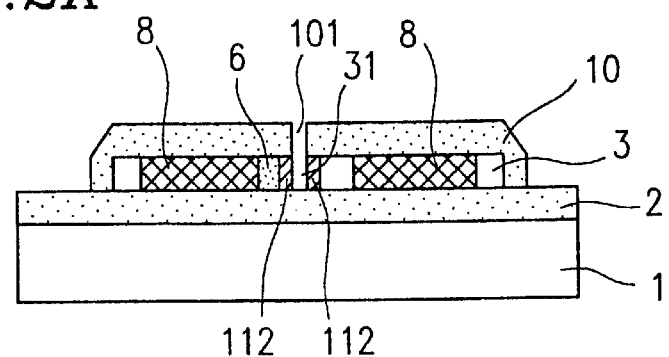

Next, the third $SiO_2$ film 10 is anisotropically etched so as to allow the opening 111 of the resist 11 for electron beam exposure to be transcribed to the third $SiO_2$ film 10, so that the third $SiO_2$ film 10 has an opening 101 (see FIG. 2K). A dry etching which causes minimum damage is utilized for this etching process, e.g., by employing ECR or high-density ICP, which provide excellent anisotropy.

The method for forming the opening 101 in the third $SiO_2$ film 10 is not limited to the EB exposure method as described above, but any other method may be employed, e.g., an exposure technique employing an excimer light source, a phase shift exposure technique, an X-ray exposure technique, or the like.

Next, by utilizing the third $SiO_2$ film 10 having the opening 101 and the resist 11 having the opening 111 as a mask, the device structural silicon layer 3 is etched until the underlying $SiO_2$ film 2 is exposed. Thus, an opening 31 is formed in the device structural silicon layer 3, as shown in FIG. 2K. A dry etching utilizing a high-density plasma which causes minimum damage to the crystal structure of the etched material is utilized for this etching process, e.g., by employing ECR or high-density ICP, which provide excellent anisotropy.

According to the present example, a thermal treatment is performed next in order to allow for recovery from the damage which was inflicted during the aforementioned dry etching process. The process temperature and process time of the thermal treatment are set at such values that the doping profiles of the collector region 3 and the emitter region 6 do not change substantially. Thereafter, the resist 11 for electron beam exposure is removed. In order to remove any damaged layer that has emerged through the aforementioned dry etching process and to purify the growth front prior to effecting the crystal growth of an SiGe layer 12 which will become a base layer (see FIG. 2L), the exposed surface of the device structural silicon layer 3 (which defines the side walls of the opening 31) is etched. Specifically, in order to remove a sufficient amount of damaged layer while preventing the opening from becoming excessively wide, an etching process using fuming nitric acid and an etching process using hydrofluoric acid are alternated, so that the surface of the device structural silicon layer 3 is etched away along its side walls by several nm to about 10 nm.

Figure 2L:
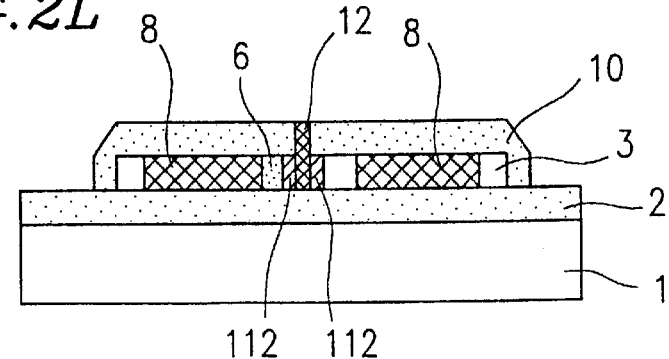

Next, as shown in FIG. 2K, a monocrystalline n type silicon layer 112, which serves as a spacer layer, is formed on the inner side walls of the opening 31 of the device structural silicon layer 3 that have been exposed through the aforementioned etching process, by performing a selective epitaxial growth process via a CVD technique using dichlorosilane as a material gas. Furthermore, as shown in FIG. 2L, a monocrystalline p type SiGe layer 12 to become a true base layer is formed on the surface of the spacer layer 112. The monocrystalline p type SiGe layer 12 grows so as to fill the opening 31 of the device structural silicon layer 3. The monocrystalline p type SiGe layer 12 grows so as to have a lateral thickness (i.e., thickness along a direction which is parallel to the substrate surface) of about 0.05 $\mu$m to about 0.2 $\mu$m, depending on the width of the opening 31.

More specifically, during the above growth process of the monocrystalline p type SiGe layer 12, the monocrystalline p type SiGe layer 12 grows along the lateral direction from the spacer layer 112 provided on both inner side walls of the opening 31 of the device structural silicon layer 3. A facet appears on the upper side of the growing monocrystalline p type SiGe layer 12. As the lateral growth proceeds, portions of the monocrystalline p type SiGe layer 12 growing from both side walls finally meet substantially in the middle, thereby filling the opening 31 of the device structural silicon layer 3. When the laterally growing portions of the monocrystalline p type SiGe layer 12 have just met, only the aforementioned facet is exposed on the upper surface of the p type SiGe layer 12 which fills the opening 31. Then, the monocrystalline p type SiGe layer 12 keeps growing in the upper direction (i.e., perpendicularly to the substrate surface) from this facet. As a result, as shown in FIG. 2L, the opening 101 of the third $SiO_2$ film 10, which is located above the opening 31 of the device structural silicon layer 3, is also filled with what has grown of the monocrystalline p type SiGe layer 12.

Since Si and Ge have different crystal lattice constants, growing SiGe crystal on Si may eventually result in the generation of crystal defects as the thickness of the grown film exceeds a predetermined thickness (or the "critical thickness"), which detracts from the crystallinity of the product, assuming a constant Ge component ratio in SiGe. According to the present example, as described above, the growth of the monocrystalline SiGe layer 12 within the opening 31 of the device structural silicon layer 3 occurs along the lateral direction (i.e., in a direction which is parallel to the substrate surface). Therefore, the aforementioned critical thickness is determined as a function of the width (or the "opening width") of the opening 31 of the device structural silicon layer 3. Although the relationship between the exact composition of a SiGe material and the critical thickness in a lateral growth scheme is rather unclear, the relationship is presumably similar to its counterpart for the usual vertical growth scheme (which involves crystal growth in the direction perpendicular to the substrate surface). Accordingly, the Ge component ratio in the monocrystalline SiGe layer 12 is selected so that the value of the critical thickness as a function of the Ge component ratio becomes substantially larger than the value of the opening width.

The doping amount for the monocrystalline p type SiGe layer 12 may be about $1 \times 10^{18}$ cm$^{-3}$ to about $5 \times 10^{19}$ cm$^{-3}$.

Alternatively, a two-step doping may be performed by employing a doping amount of about $1 \times 10^{18}$ cm$^{-3}$ to about $5 \times 10^{19}$ cm$^{-3}$ for a lower portion of the monocrystalline p type SiGe layer 12 spanning the same thickness as that of the active region defined by the device structural silicon layer 3 (i.e., a portion corresponding to a portion 212 in FIG. 3L; described later in connection with Example 3 of the present invention), and by employing a doping amount on the order of $10^{19}$ cm$^{-3}$ to about $10^{20}$ cm$^{-3}$ for any portion of the monocrystalline p type SiGe layer 12 above the upper face of the active region (=the device structural silicon layer 3) in order to reduce the contact resistance.

The thickness of the monocrystalline p type SiGe layer 12 along the vertical direction (i.e., in the direction perpendicular to the substrate surface) is preferably set to a value which is equal to or greater than the thickness of the device structural silicon layer 3 composing the active region. As a result, a base electrode 14 and either side wall of the emitter layer 6 or the collector layer 3 are prevented from directly contacting each other to cause electrical short-circuiting during the formation of the base electrode 14.

Next, in preparation for the formation of the base electrode 14, a resist pattern (not shown) having an opening corresponding to a portion in which the base electrode 14 will be formed by photolithography so as to cover the SiO$_2$ film 10. Next, a metal layer for composing the base electrode 14 is deposited, followed by a lift-off process. Thus, the base electrode 14 is formed in a predetermined pattern. The base electrode 14 is formed above and in electrical contact with the monocrystalline p type SiGe layer 12 (true base layer).

Finally, predetermined portions of the third SiO$_2$ film 10 (i.e., portions overlying the ohmic contact regions 8 to function as an emitter contact layer and a collector contact layer) are etched away, where a collector electrode 15 and an emitter electrode 13 are formed by using a metal such as Al.

Figure 2M:
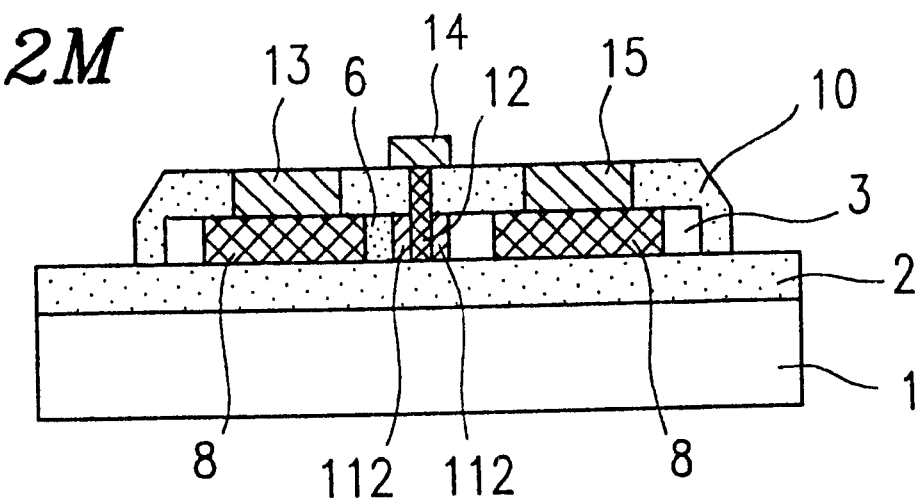

Through the aforementioned steps, a lateral heterojunction bipolar transistor incorporating an SOI substrate according to the present invention having the structure shown in FIG. 2M is completed.

According to the present example, the spacer layer 112 is grown prior to the growth of the monocrystalline p type SiGe layer 12 (which serves as a true base layer) for the following reasons.

As described above, the lateral thickness of the monocrystalline p type SiGe layer 12 to become a true base layer may typically be about 0.05 μm to about 0.2 μm, depending on the width of the opening 31 (or the "opening width") of the device structural silicon layer 3. In practice, however, a commonly-employed semiconductor process is only as good as creating an opening width of about 0.05 μm. Furthermore, the dry etching process and the surface treatment process which is performed prior to the crystal growth of the SiGe layer 12 may cause the width of the opening 31 to become larger than the aforementioned range along the lateral direction of the device structural silicon layer 3 (active region). The increase in the width of the opening 31 along the lateral direction, and hence the increase in the lateral film thickness of the p type SiGe that has been grown (i.e., thickness of the base layer), impose some limits on the high frequency characteristics of the bipolar transistor as a final product.

Furthermore, etching damage persists in the surface of the etched device structural silicon layer 3 (or on the inner side walls of the opening 31). Therefore, there is a high likelihood that the amplification gain may deteriorate due to emitter-base carrier recombination and base-collector carrier recombination.

Therefore, according to the present example, the spacer layer 112 composed of a monocrystalline n type Si layer is first formed in the opening 31, and then the p type SiGe layer 12 to become a true base layer is formed thereupon. As a result, it is possible to form true emitter-base-collector regions through consecutive epitaxial growth processes, without allowing the true base layer to be formed directly on any crystal surface that has been damaged by dry etching. Thus, a pn junction face between the emitter and the base, or between the base and the collector, both of which play an important role in the operation of a bipolar transistor, can be formed as a high quality pn junction which is free of damage caused by dry etching.

The n type Si spacer layer 112 described in the present example may be obtained by growing an Si layer with doping. Alternatively, the n type Si spacer layer 112 may be obtained by growing a non-doped Si layer, interrupting the growth, and allowing an n type dopant in the already-formed emitter region 6 and the collector region 3 to diffuse into the Si layer through a thermal treatment.

By forming the spacer layer 112 from an n type silicon as in the present example, the n type Si spacer layer 112 can function as part of the emitter region 6 or the collector region 3 within the active region of the final bipolar transistor structure. As a result, the base width of the final transistor product (i.e., the lateral width of the p type SiGe layer 12, namely the opening width of the opening 31 of the device structural silicon layer 3) can be effectively reduced.

Alternatively, the spacer layer 112 may be composed of a non-doped SiGe layer, or more generally, a layer of material having a composition expressed as non-doped $Si_yGe_{1-y}$ (where $0 \leq y \leq 1$). In this case, it is possible to prevent a pn junction from being formed within the n type silicon composing the emitter region 6 and the collector region 3 during the growth of the p type SiGe layer 12 composing the true base layer, which might otherwise occur due to diffusion of a p type dopant (which may generally be boron).

Alternatively, a spacer layer composed of a monocrystalline n type silicon may be first formed, and a spacer layer composed of a non-doped SiGe (or non-doped $Si_yGe_{1-y}$ where $0 \leq y \leq 1$) may be further formed on the surface of the spacer layer, and thereafter the p type SiGe layer 12 (true base layer) may be grown.

In another embodiment of the present invention, a lateral homo-junction bipolar transistor incorporating an SOI substrate may be produced, instead of the above-described lateral hetero-junction bipolar transistor. This can be accomplished by epitaxially growing a monocrystalline p type Si layer, instead of the monocrystalline p type SiGe layer 12, so as to fill the opening 31 of the device structural silicon layer 3 and the opening 101 of the third $SiO_2$ film 10 during the process illustrated in FIG. 2L. By allowing this monocrystalline p type Si layer to function as a true base layer, a lateral homo-junction bipolar transistor can be formed by performing the other processes in a manner similar to the above.

More generally, a layer of a composition expressed as p-$Si_xGe_{1-x}$ (where $0 \leq x \leq 1$) may be epitaxially grown so as to fill the opening 31 of the device structural silicon layer 3 and the opening 101 of the third $SiO_2$ film 10 to function as a true base layer.

EXAMPLE 3

An npn type lateral SiGe hetero-bipolar transistor (HBT) according to Example 3 of the present invention will be described.

Figure 3A:
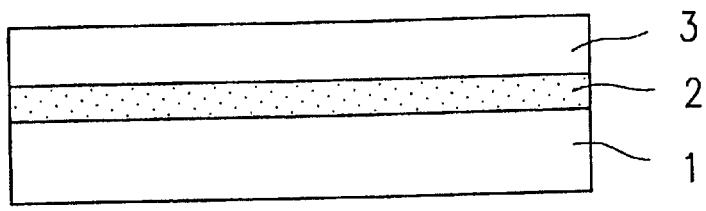
FIGS. 3A, 3B, 3C, 3D, 3E, 3F, 3G, 3H, 3I, 3J, 3K, 3L, 3M, 3N, 3O, and 3P are cross-sectional views illustrating respective production steps for obtaining a lateral bipolar transistor according to Example 3 of the present invention.
Figure 3B:
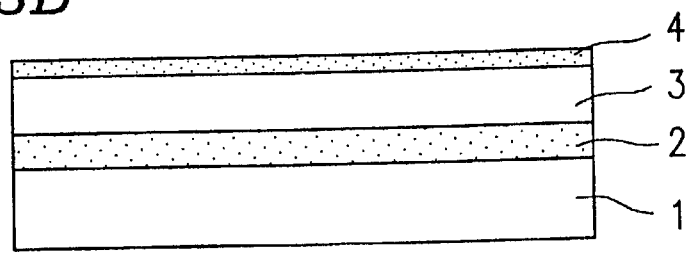
Figure 3C:
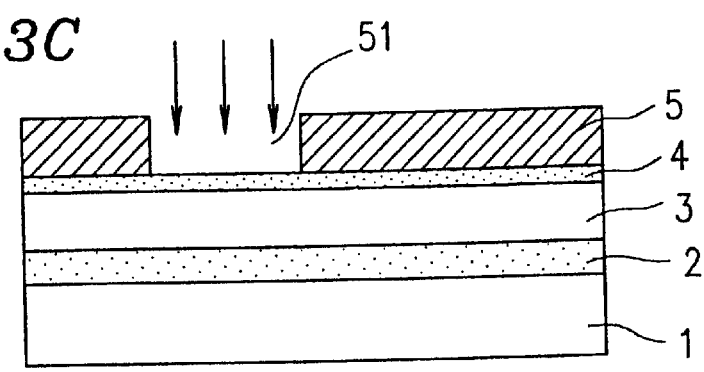
Figure 3D:
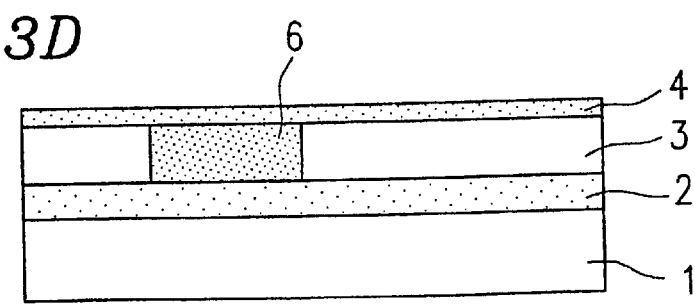
Figure 3E:
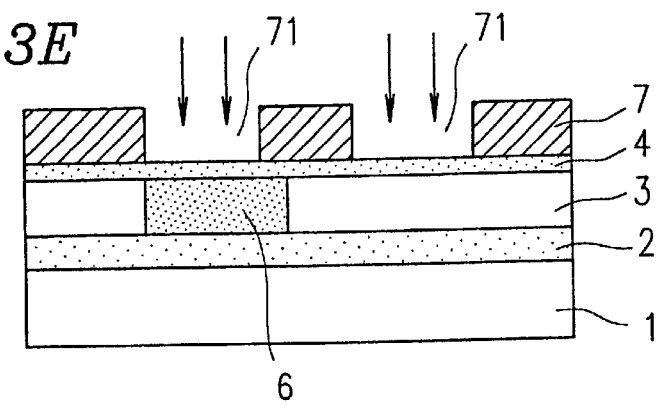
Figure 3F:
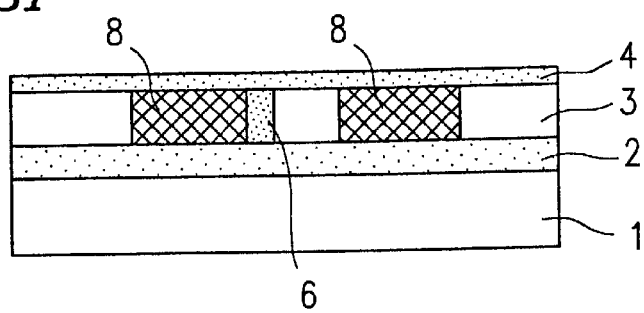
Figure 3G:
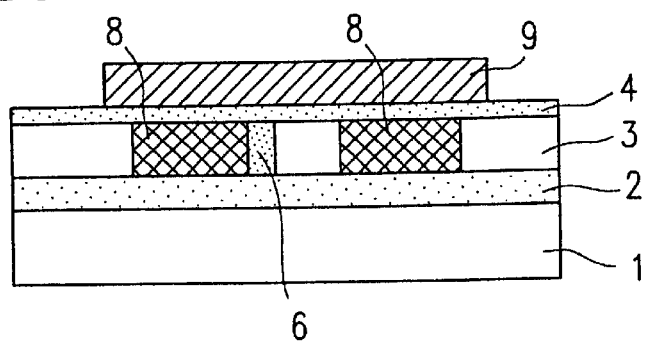
Figure 3H:
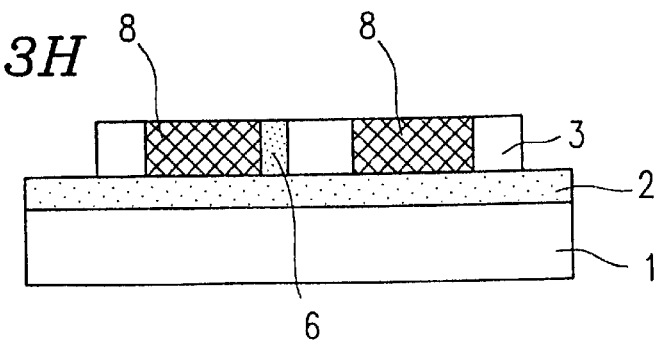
Figure 3I:
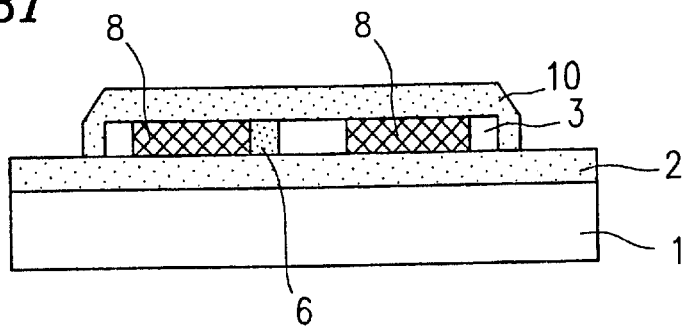
Figure 3J:
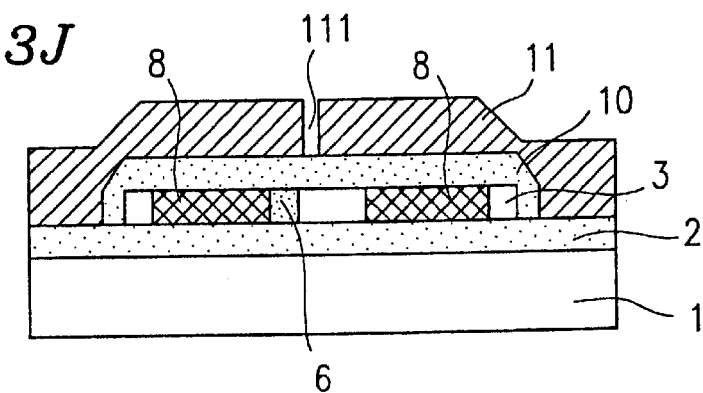
Figure 3K:
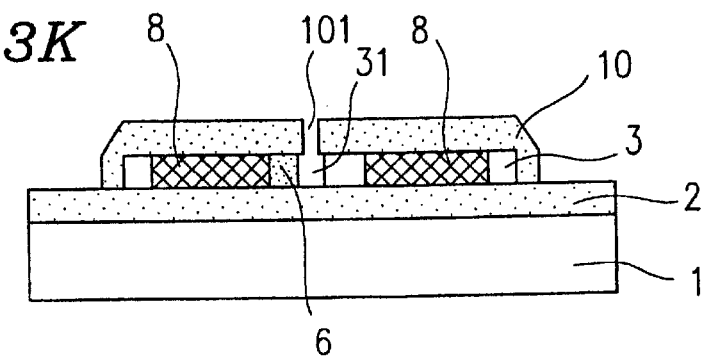
Figure 3L:
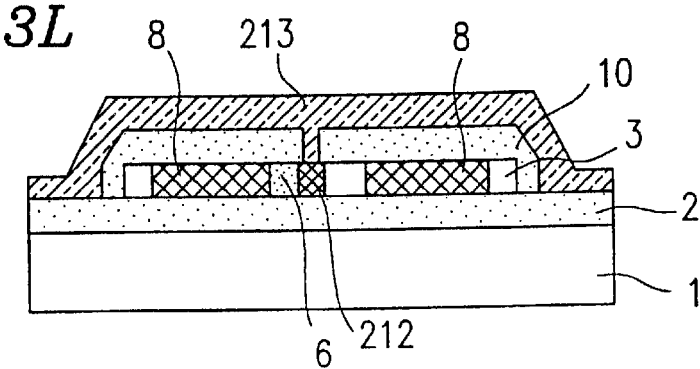
Figure 3M:
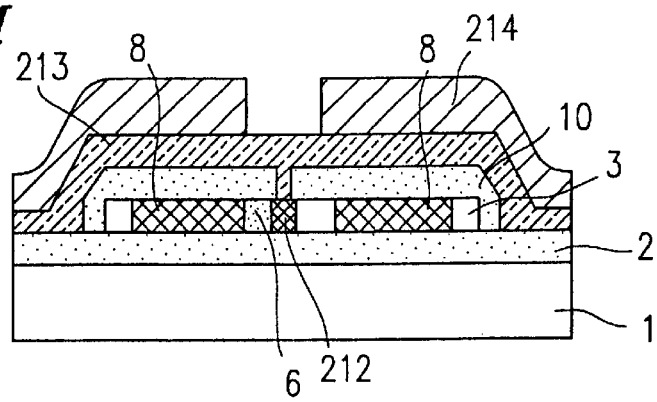
Figure 3N:
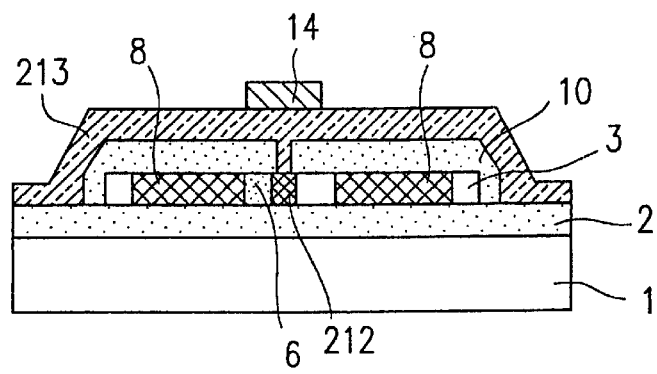
Figure 3O:
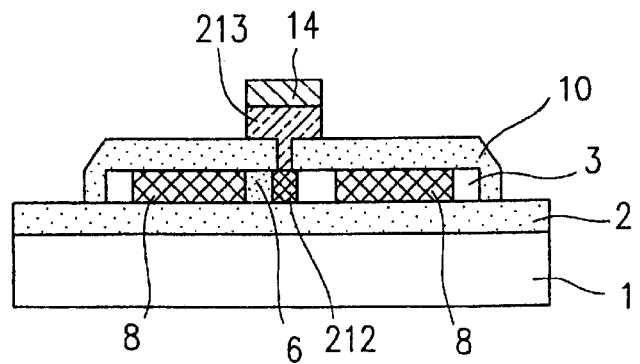
Figure 3P:
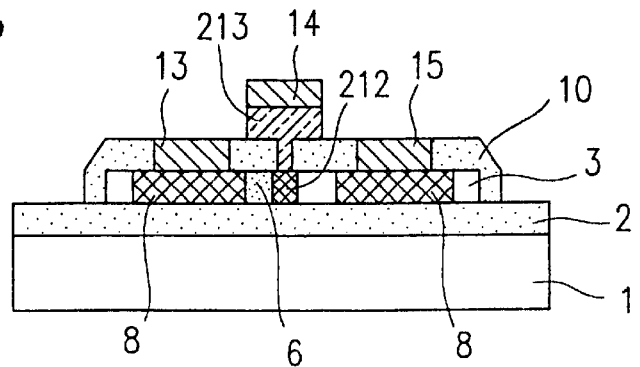
Figure 4:
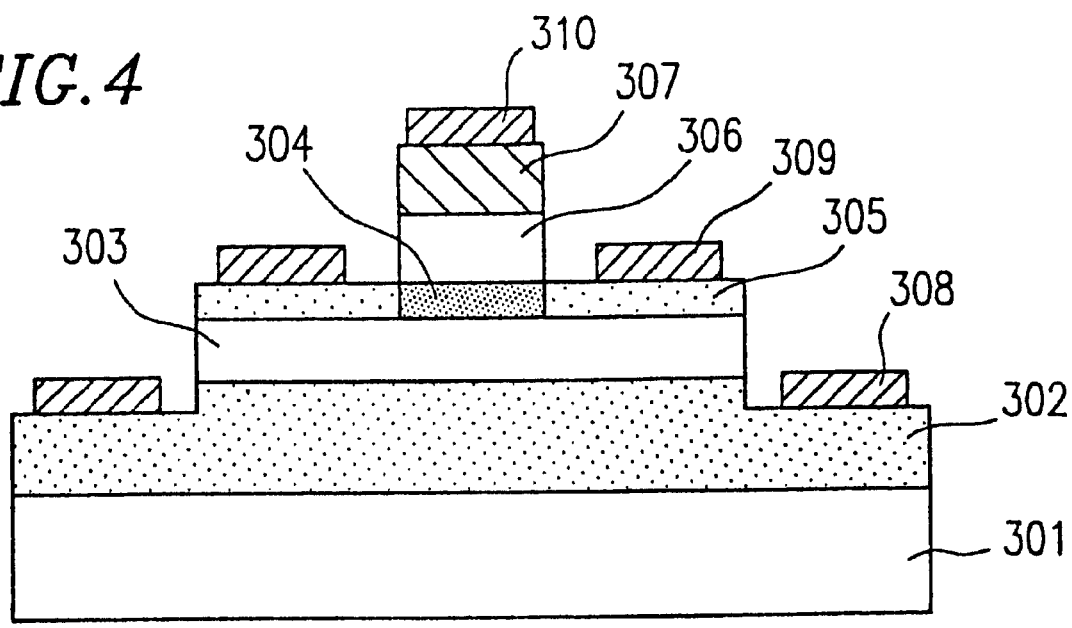
FIG. 4 is a schematic cross-sectional view illustrating an npn type SiGe/Si vertical hetero-bipolar transistor (HBT) produced by a conventional technique.

FIGS. 3A to 3P are cross-sectional views illustrating respective production steps for obtaining an npn type lateral SiGe HBT according to Example 3 of the present invention. Hereinafter, a method for producing an npn type lateral SiGe HBT according to Example 3 of the present invention will be described, following the order of respective steps.

First, as shown in FIG. 3A, an SOI substrate which has been formed by an attachment technique or a SIMOX technique is prepared. The SOI substrate includes a device structural silicon layer (n type monocrystalline silicon layer) 3 and an embedded $SiO_2$ film (which serves as a "first $SiO_2$ film") 2 formed on a silicon support substrate 1. The device structural silicon layer 3 has a thickness of about 2000 angstroms. The embedded $SiO_2$ film 2 has a thickness of about 300 nm or more in order to reduce the parasitic capacitance between the device structural silicon layer 3 and the silicon support substrate 1. The n type doping amount in the device structural silicon layer 3 is about $5 \times 10^{16}$ cm$^{-3}$ to about $5 \times 10^{17}$ cm$^{-3}$ which corresponds to the doping amount in a collector layer that is to be formed later.

Next, as shown in FIG. 3B, the surface of the device structural silicon layer 3 is oxidized so as to form a protective oxidation film (which serves as a "second $SiO_2$ film") 4 having a thickness of about 10 nm to about 50 nm, whereby the surface of the device structural silicon layer 3 is protected.

Next, as shown in FIG. 3C, a resist layer (or "resist pattern") 5 having an opening 51 in a portion in which an emitter region 6 (see FIG. 3D) is to be formed is provided on the protective oxidation layer 4 by photolithography. Then, by performing an ion implantation process over the entire surface while utilizing the resist layer 5 as a mask, the n type emitter region 6 is formed as shown in FIG. 3D. Thereafter, the resist layer 5 is removed.

In the case of an npn type device, an n type emitter and an n type collector are to be formed. Therefore, an n type dopant, e.g., phosphorous (P) or arsenic (As), is used as an ion species for the above ion implantation process. Such ion species may be implanted at a doping amount of about $5 \times 10^{18}$ cm$^{-3}$ to about $5 \times 10^{20}$ cm$^{-3}$.

Next, as shown in FIG. 3E, a further resist layer 7 having openings 71 corresponding to portions in which n type Si ohmic contact regions 8 (see FIG. 3F) are to be formed is provided on the protective oxidation layer 4 by photolithography. The n type Si ohmic contact regions 8 will function as an emitter contact region and a collector contact region. Then, by performing an ion implantation process over the entire surface while utilizing the resist layer 7 as a mask, then type Si ohmic contact regions (i.e., an emitter contact region and a collector contact region) 8 are formed as shown in FIG. 3F. Thereafter, the resist layer 7 is removed.

An n type dopant, e.g., P or As, is used as an ion species for the above ion implantation process. Such ion species may be implanted at a high doping amount of about $1 \times 10^{19}$ cm$^{-3}$ or more in order to reduce the contact resistance of the electrodes. The resist masking layer 7 which is utilized for the above ion implantation process is patterned so that the ends of the resultant n type Si ohmic contact regions 8 will not overlap with the collector end of the previously-formed n type Si emitter region 6 and that the n type Si emitter region 6 will be interposed between the n type Si ohmic contact regions 8.

Next, as shown in FIG. 3G, from the perspective of device separation, a further resist layer 9 is provided on the protective oxidation layer 4 by photolithography in a portion overlying a region to become an active region of the HBT. Then, the device structural silicon layer 3 is subjected to a dry or wet etching while utilizing the resist layer 9 as a mask, until the embedded $SiO_2$ film 2 is exposed. Thus, a mesa-separated active region is formed (FIG. 3H). The remainder of the device structural silicon layer 3 on the mesa-separated active region will function as a collector region 3.

Although the present example illustrates the case where a simple mesa separation technique is used as a method for achieving device separation, the present invention is not limited thereto. Any other separation method may be suitably used, e.g., a pn separation method which involves forming the surrounding portion of an active region with a material of the opposite conductive type from the conductivity type of the active region, or a separation method which involves oxidizing the surrounding portion of an active region to form $SiO_2$.

Next, a thermal treatment for activating the implanted dopant is performed. The treatment is typically conducted at a temperature of about 900° C. to about 1100° C.

Next, the entire substrate surface is subjected to a thermal oxidation process, thereby forming a third $SiO_2$ film 10 on the surface of the active region as shown in FIG. 3I. As the method for forming the third $SiO_2$ film 10, it is also possible to first perform a very shallow surface thermal oxidation and then perform a CVD process to form a further $SiO_2$ film, instead of subjecting the entire substrate surface to a thermal oxidation process. In the case of employing thermal oxidation, since the surface of the device structural silicon layer 3 is partially oxidized so that the device structural silicon layer 3 has a reduced thickness, it is necessary to ensure that the device structural silicon layer 3 has a larger initial thickness which accounts for the decrease in thickness due to oxidation. The third $SiO_2$ film 10 typically has a thickness of 100 nm to about 200 nm.

Next, in order to form a base region, a resist 11 for electron beam exposure is applied. By performing an electron beam exposure and then a developing process, a resist layer 11 having an opening 11 which is about 0.05 μm to about 0.2 μm wide is formed, as shown in FIG. 3J. As the resist 11 for electron beam exposure, a resist material composed essentially of PMMA, which is commonly used for electron beam lithography, may be used. In order to facilitate dry-etching of the third SiO$_2$ film by using the resist 11 as a mask, it is preferable to employ a resist material having excellent dry-etching resistance, e.g., ZEP (Nippon Zeon) for the resist 11.

Next, the third SiO$_2$ film 10 is anisotropically etched so as to allow the opening 111 of the resist 11 for electron beam exposure to be transcribed to the third SiO$_2$ film 10, so that the third SiO$_2$ film 10 has an opening 101 (see FIG. 3K). A dry etching which causes minimum damage is utilized for this etching process, e.g., by employing ECR or high-density ICP, which provide excellent anisotropy.

The method for forming the opening 101 in the third SiO$_2$ film 10 is not limited to the EB exposure method as described above, but any other method may be employed, e.g., an exposure technique employing an excimer light source, a phase shift exposure technique, an X-ray exposure technique, or the like.

Next, by utilizing the third SiO$_2$ film 10 with the opening 101 and the resist 11 with the opening 111 as a mask, the device structural silicon layer 3 is etched until the underlying SiO$_2$ film 2 is exposed. Thus, an opening 31 is formed in the device structural silicon layer 3, as shown in FIG. 3K. A dry etching utilizing a high-density plasma which causes minimum damage to the crystal structure of the etched material is utilized for this etching process, e.g., by employing ECR or high-density ICP, which provide excellent anisotropy.

According to the present example, a thermal treatment is performed next in order to allow for recovery from the damage which was inflicted during the aforementioned dry etching process. The process temperature and process time of the thermal treatment are set at such values that the doping profiles of the collector region 3 and the emitter region 6 do not change substantially. Thereafter, the resist 11 for electron beam exposure is removed. In order to remove any damaged layer that has emerged through the aforementioned dry etching process and to purify the growth front prior to effecting the crystal growth of an SiGe layer 12 which will become a base layer (see FIG. 2L), the exposed surface of the device structural silicon layer 3 (which defines the side walls of the opening 31) is etched. Specifically, in order to remove a sufficient amount of damaged layer while preventing the opening from becoming excessively wide, an etching process using fuming nitric acid and an etching process using hydrofluoric acid are alternated, so that the surface of the device structural silicon layer 3 is etched away along its side walls by several nm to about 10 nm.

Next, as shown in FIG. 3L, a monocrystalline p type SiGe layer 212 (or "lower SiGe layer 212") to become a true base layer is formed on the inner side walls of the opening 31 of the device structural silicon layer 3 that have been exposed through the aforementioned etching process, by performing a selective epitaxial growth process via a CVD technique using dichlorosilane as a material gas. The monocrystalline p type SiGe layer 212 grows so as to fill the opening 31 of the device structural silicon layer 3. The monocrystalline p type SiGe layer 212 grows so as to have a lateral thickness (i.e., thickness along a direction which is parallel to the substrate surface) of about 0.05 μm to about 0.2 μm, depending on the width of the opening 31.

More specifically, during the above growth process of the monocrystalline p type SiGe layer 212, the monocrystalline p type SiGe layer 212 grows along the lateral direction from both inner side walls of the opening 31 of the device structural silicon layer 3. A facet appears on the upper side of the growing monocrystalline p type SiGe layer 212. As the lateral growth proceeds, portions of the monocrystalline p type SiGe layer 212 growing from both side walls finally meet substantially in the middle, thereby filling the opening 31 of the device structural silicon layer 3. When the laterally growing portions of the monocrystalline p type SiGe layer 212 have just met, only the aforementioned facet is exposed on the upper surface of the p type SiGe layer 212 which fills the opening 31.

Since Si and Ge have different crystal lattice constants, growing SiGe crystal on Si may eventually result in the generation of crystal defects as the thickness of the grown film exceeds a predetermined thickness (or the "critical thickness"), which detracts from the crystallinity of the product, assuming a constant Ge component ratio in SiGe. According to the present example, as described above, the growth of the monocrystalline SiGe layer 212 on the inner side walls of the opening 31 of the device structural silicon layer 3 occurs along the lateral direction (i.e., in a direction which is parallel to the substrate surface). Therefore, the aforementioned critical thickness is determined as a function of the width (or the "opening width") of the opening 31 of the device structural silicon layer 3. Although the relationship between the exact composition of a SiGe material and the critical thickness in a lateral growth scheme is rather unclear, the relationship is presumably similar to its counterpart for the usual vertical growth scheme (which involves crystal growth in the direction perpendicular to the substrate surface). Accordingly, the Ge component ratio in the monocrystalline SiGe layer 212 is selected so that the value of the critical thickness as a function of the Ge component ratio becomes substantially larger than the value of the opening width.

Once the opening 31 of the device structural silicon layer 3 is filled with the monocrystalline p type SiGe layer (or lower SiGe layer) 212 which has grown along the lateral direction from both inner side walls in the aforementioned manner, a monocrystalline p type SiGe layer (or upper SiGe layer) 213 is allowed to grow in the upper direction (i.e., perpendicularly to the substrate surface) from this facet, by performing a non-selective SiGe growth process via a CVD technique using disilane or silane as a material gas. Since this non-selective growth process allows SiGe to grow on the third SiO$_2$ layer 10, which in itself is an insulative film, as shown in FIG. 3L, the resultant monocrystalline p type SiGe layer (or lower SiGe layer) 213 not only fills the opening 101 of the third SiO$_2$ film 10 (which is located above the opening 31 of the device structural silicon layer 3), but also is present upon the third SiO$_2$ layer 10 in the vicinity.

As for the doping amounts for the monocrystalline p type SiGe layers 212 and 213, a two-step doping may be performed by employing a doping amount of about $1 \times 10^{18}$ cm$^{-3}$ to about $5 \times 10^{19}$ cm$^{-3}$ for the lower monocrystalline p type SiGe layer 212 spanning the same thickness as that of the active region defined by the device structural silicon layer 3, and by employing a doping amount on the order of $10^{19}$ cm$^{-3}$ to about $10^{20}$ cm$^{-3}$ for the upper monocrystalline p type SiGe layers 213 above the upper face of the active region (=the device structural silicon layer 3) in order to reduce the contact resistance.

Next, in preparation for the formation of the base electrode 14, a resist pattern 214 (see FIG. 3M) having an opening corresponding to a portion in which the base electrode 14 will be formed is formed by photolithography. Next, a metal layer for composing the base electrode 14 is deposited, followed by a lift-off process. Thus, the base electrode 14 is formed in a predetermined pattern. The base electrode 14 is formed above and in electrical contact with the monocrystalline p type SiGe layer 213 (FIG. 3N).

Furthermore, a dry etching is performed by utilizing the already-formed base electrode 14 as a mask so as to remove any SiGe layer that was formed on the third SiO₂ layer 10 during the aforementioned non-selective growth process (FIG. 3O).

Finally, predetermined portions of the third SiO₂ film 10 (i.e., portions overlying the ohmic contact regions 8 to function as an emitter contact layer and a collector contact layer) are etched away, where a collector electrode 15 and an emitter electrode 13 are formed by using a metal such as Al.

Through the aforementioned steps, a lateral hetero-junction bipolar transistor incorporating an SOI substrate according to, the present invention having the structure shown in FIG. 3P is completed.

In the process according to the present example of the invention, a T-shaped base structure (i.e., the p type SiGe layers 212 and 213 and the base electrode 14) is formed. The upper SiGe layer 213 substantially functions as a base contact region for the lower SiGe layer 212, which functions as a true base region. As a result, the true base region (lower SiGe layer 212) is prevented from being damaged during the formation of the base electrode 14, and any deterioration in the state of interfacing between the base electrode 14 and the true base region (lower SiGe layer 212) can be prevented.

In the present example, it is also applicable to form the true base region (lower SiGe layer 212) with a spacer layer (such as that described in Example 2) interposed therebetween.

In another embodiment of the present invention, a lateral homo-junction bipolar transistor incorporating an SOI substrate may be produced, instead of the above-described lateral hetero-junction bipolar transistor. This can be accomplished by epitaxially growing a monocrystalline p type Si layer, instead of the monocrystalline p type SiGe layer 12, so as to fill the opening 31 of the device structural silicon layer 3 and the opening 101 of the third SiO₂ film 10 during the process illustrated in FIG. 3L. By allowing this monocrystalline p type Si layer to function as a true base layer, a lateral homo-junction bipolar transistor can be formed by performing the other processes in a manner similar to the above.

More generally, a layer of a composition expressed as p-$Si_xGe_{1-x}$ (where $0 \leq x \leq 1$) may be epitaxially grown so as to fill the opening 31 of the device structural silicon layer 3 and the opening 101 of the third SiO₂ film 10 to function as a true base layer.

Thus, according to the present invention, the thickness of the active region of a lateral bipolar transistor can be reduced so as to attain a relatively small junction capacitance. The thickness of the base layer and the base resistance can both be reduced. By employing an SOI substrate, the parasitic capacitance between the device and the substrate as well as the parasitic capacitance between devices can be reduced, so that the high-speed operation characteristics that are inherent in each device can be adequately elicited.

Thus, according to the present invention, a hetero-junction or homo-junction bipolar transistor having improved high-speed operation characteristics can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A lateral bipolar transistor comprising:
    a substrate;
    a first insulative region formed on the substrate;
    a first semiconductor region of a first conductivity type selectively formed on the first insulative region;
    a second insulative region formed so as to substantially cover the first semiconductor region; and
    a second semiconductor region of a second conductivity type different from the first conductivity type, a second semiconductor region being selectively formed,
    wherein:
    the second insulative region has a first opening which reaches a surface of the first semiconductor region, and the first semiconductor region has a second opening under the first opening which reaches the underlying first insulative region, the second opening being provided in a position corresponding to the first opening of the second insulative region;
    the second semiconductor region entirely fills the first opening and the second opening, thereby functioning as a base region;
    a lower portion of the second semiconductor region which at least fills the second opening is formed by lateral growth from a face of the first semiconductor region defining a side wall of the second opening; and
    the first semiconductor region includes an emitter region and a collector region formed therein.

2. A lateral bipolar transistor according to claim 1, wherein the first semiconductor region comprises monocrystalline n type Si, and the second semiconductor region comprises p type $Si_xGe_{1-x}$ (where $0 \leq x \leq 1$).

3. A lateral bipolar transistor according to claim 2, wherein the lower portion of the second semiconductor region which at least fills the second opening has a multilayer structure at least including a first portion and a second portion, the first portion being in contact with the face of the first semiconductor region defining the side wall of the second opening, and the second portion being in contact with the first portion.

4. A lateral bipolar transistor according to claim 3, wherein the first portion comprises Si of the first conductivity type, and
wherein the second portion comprises $Si_xGe_{1-x}$ (where $0 \leq x \leq 1$) of the second conductivity type.

5. A lateral bipolar transistor according to claim 1, wherein the first portion comprises non-doped $Si_yGe_{1-y}$ (where $0 \leq y \leq 1$), and
wherein the second portion comprises $Si_xGe_{1-x}$ (where $0 \leq x \leq 1$) of the second conductivity type.

6. A lateral bipolar transistor according to claim 1, wherein an upper portion of the second semiconductor region which fills the first opening of the second insulative region has a carrier concentration higher than a carrier concentration in the lower portion of the second semiconductor region which at least fills the second opening of the first semiconductor region.

7. A lateral bipolar transistor according to claim 1, wherein an upper portion of the second semiconductor region which fills the first opening of the second insulative region has a carrier concentration higher than a carrier concentration in the lower portion of the second semiconductor region which at least fills the second opening of the first semiconductor region, and
wherein the upper portion of the second semiconductor region having the higher carrier concentration is also present on a surface of the second insulative region.

* * * * *